United States Patent [19]
Asher et al.

[11] Patent Number: 5,711,884
[45] Date of Patent: Jan. 27, 1998

[54] METHOD OF FILTERING SUBMICRON PARTICLES WITH GEL LATTICE MEMBRANE FILTER

[75] Inventors: Sanford A. Asher, Pittsburgh, Pa.; Jay Henis, St. Louis, Mo.

[73] Assignee: University of Pittsburgh of the Commonwealth System of Higher Education, Pittsburgh, Pa.

[21] Appl. No.: 561,162

[22] Filed: Nov. 21, 1995

Related U.S. Application Data

[63] Continuation of Ser. No. 151,476, Nov. 12, 1993, abandoned, which is a continuation-in-part of Ser. No. 571,251, Aug. 22, 1990, Pat. No. 5,281,370.

[51] Int. Cl.$^6$ .................... B01D 69/00; B01D 61/14
[52] U.S. Cl. .................... 210/650; 210/639; 210/748; 210/767
[58] Field of Search .................... 210/335, 500.26, 210/500.34, 500.35, 506, 649–651, 635, 500.22, 243, 348, 500.27, 500.38, 639, 638, 748, 767; 96/4, 5; 95/273

[56] References Cited

U.S. PATENT DOCUMENTS

| | | |
|---|---|---|
| 3,004,904 | 10/1961 | Gregor et al. |
| 3,276,598 | 10/1966 | Michaels et al. .................... 210/500.34 |
| 3,509,063 | 4/1970 | Teague et al. |
| 3,620,597 | 11/1971 | Schwartz et al. |
| 3,720,593 | 3/1973 | Juhos .................... 204/299 X |
| 3,773,684 | 11/1973 | Marks . |
| 3,808,305 | 4/1974 | Gregor .................... 210/500.35 |

(List continued on next page.)

FOREIGN PATENT DOCUMENTS

| | | | |
|---|---|---|---|
| 2175737 | 7/1990 | Japan | .................... 96/4 |

OTHER PUBLICATIONS

Rundquist et al., "Collective diffusion in Colloidal crystals", *J. Chem. Phys.*, vol. 95, No. 11, Dec. 1991, pp. 8546–8551.
Asher et al., "New nonlinear Braff diffraction devices", *SPIE* vol. 1626 Non linear Optics III, 1992, pp. 238–242.
Kesavamoorthy et al., "Nanosecond photothermal dynamics in colloidal suspension", *J. Appl. Phys.*, vol. 71, No. 3, Feb. 1992, pp. 1116–1123.

(List continued on next page.)

*Primary Examiner*—Joseph W. Drodge
*Attorney, Agent, or Firm*—Arnold B. Silverman; Diane R. Meyers; Eckert Seamans Cherin & Mellott, LLC

[57] ABSTRACT

A method of making a solid filter material which filters a predetermined wavelength band from a broader spectrum of radiation is provided. The method includes creating a colloidal structure composed of particles dispersed within a medium, and introducing a solvent thereto. Thereafter, the solvent is evaporated and the remaining structure solidifies into a solid crystalline array. The particles can also be fused together by polymerization using one of several methods which are provided. In another embodiment, methods of filtering submicron particles have been developed which consists of establishing a gel membrane from a crystalline colloidal array with an interstice size less than or equal to the particles to be filtered are disclosed. The gel membrane may employ anisotropic interstices of submicron size and is stretchable or compressible mechanically. The method also includes stacking a plurality of gel membrane filters so that the material to be filtered sequentially flows through the interstices of the filters leaving different size submicron particles on different levels of said filters. Another embodiment of the invention has a plurality of particles having a positive or negative charge in a lattice and has oppositely charged mobile particles movable into and out of the interstices of the gel membrane. An electric field is employed to move the mobile particles to close or open the interstices of the lattice. The mobile particles can also pump material through the interstices. Decorative uses of the materials are also disclosed.

21 Claims, 5 Drawing Sheets

U.S. PATENT DOCUMENTS

| | | |
|---|---|---|
| 4,085,999 | 4/1978 | Chahroudi . |
| 4,099,854 | 7/1978 | Decker et al. . |
| 4,140,369 | 2/1979 | Howland . |
| 4,268,413 | 5/1981 | Dabisch . |
| 4,451,412 | 5/1984 | Loiseaux et al. . |
| 4,548,473 | 10/1985 | Lo et al. . |
| 4,627,689 | 12/1986 | Asher . |
| 4,632,517 | 12/1986 | Asher . |
| 4,648,686 | 3/1987 | Segawa . |
| 4,717,508 | 1/1988 | DeMartino . |
| 4,720,355 | 1/1988 | DeMartino . |
| 4,766,171 | 8/1988 | DeMartino . |
| 4,803,688 | 2/1989 | Lawandy . |
| 4,828,362 | 5/1989 | Skinner et al. . |
| 4,832,466 | 5/1989 | Nishimura et al. . |
| 4,900,135 | 2/1990 | Yuasa et al. . |
| 4,913,845 | 4/1990 | Gillberg-LaForce et al. . |
| 4,938,557 | 7/1990 | Blow . |
| 4,952,035 | 8/1990 | Yuasa et al. . |
| 4,986,635 | 1/1991 | Spry . |
| 5,015,275 | 5/1991 | Beck et al. ............... 210/500.34 |
| 5,131,736 | 7/1992 | Alvarez . |
| 5,142,418 | 8/1992 | Spry . |
| 5,281,370 | 1/1994 | Asher et al. . |

OTHER PUBLICATIONS

Zahorchak et al., "Melting of colloidal crystals: A Monte Carlo study", *J. Chem. Phys.*, vol. 96, No. 9, May 1992, pp. 6873–6879.

Philipse, "Solid opaline packings of colloidal silica spheres", *Journal of Mat'ls Science Letters* 8 (1989) (1371–1373).

Rundquist et al., "Photothermal compression of colloidal crystals", *J. Chem. Phys.*, vol. 94, No. 1, Jan. 1991, pp. 711–717.

Kesavamoorthy et al., "Colloidal crystal photothermal dynamics", *J. Chem. Phys.*, vol. 94, No. 7, Apr. 1991, pp. 5172–5179.

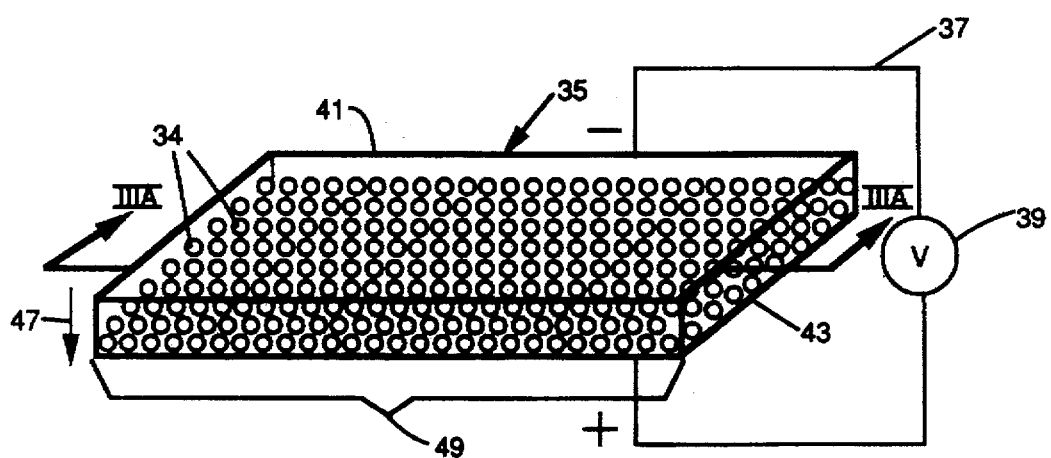
FIG. 3
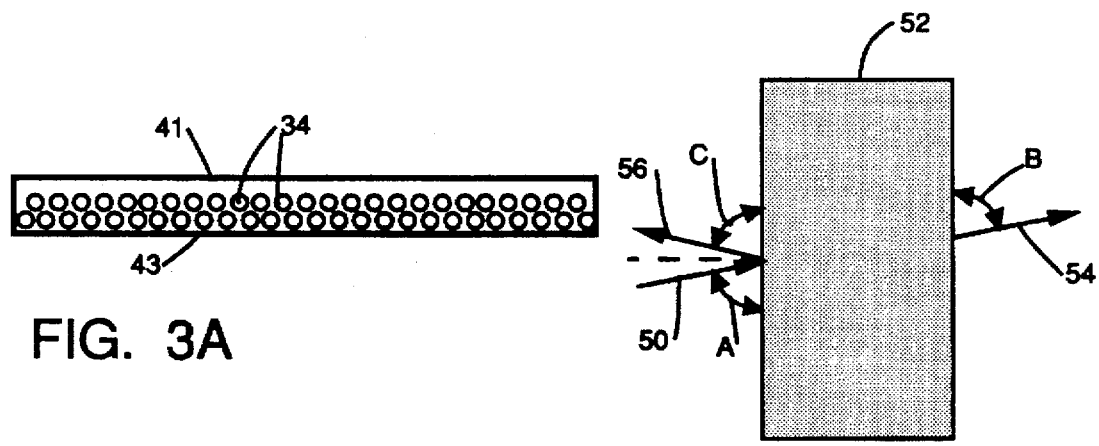
FIG. 3A
FIG. 4
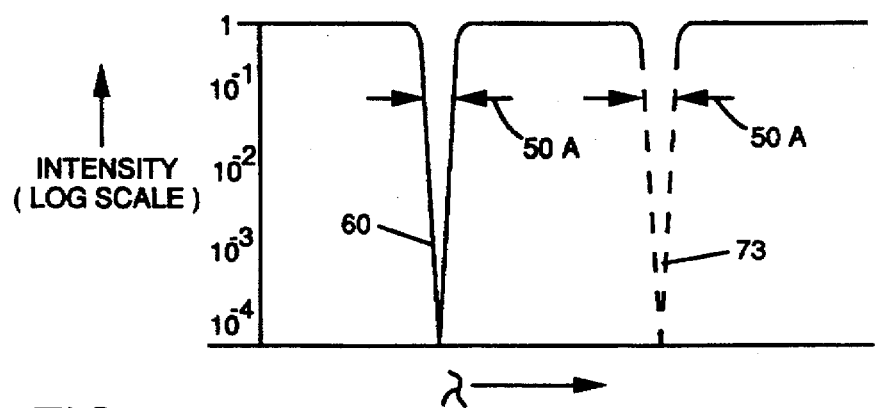
FIG. 5

METHOD OF FILTERING SUBMICRON PARTICLES WITH GEL LATTICE MEMBRANE FILTER

This application is a continuation of U.S. application Ser. No. 08/151,476, filed Nov. 12, 1993, entitled "METHOD OF FILTERING SUBMICRON PARTICLES AND ASSOCIATED PRODUCT", now abandoned, which is a continuation-in-part of U.S. application Ser. No. 07/571,251, filed Aug. 22, 1990, entitled "METHOD OF MAKING SOLID CRYSTALLINE NARROW BAND RADIATION FILTER AND RELATED DEVICE, now U.S. Pat. No. 5,281,370.

BACKGROUND OF THE INVENTION

1. Field of the Invention

The present invention relates generally to a method of creating filters which may be used to select and/or reject predetermined frequencies of electromagnetic radiation. The invention relates more particularly to a method of making solid crystalline materials in which colloidal electrically charged particles form an ordered dispersion and are solidified into a hardened material which has certain predetermined filtering characteristics.

In another embodiment of this present invention, submicron periodic materials are employed for size selective particle and molecular filtration based in part on the self-assembly properties of crystalline colloidal arrays. In this embodiment, the material may be passive or active and have switchable filtration properties.

2. Description of the Prior Art

It has been recognized that colloidal dispersions of polymer particles in various solvents can form crystalline structures having lattice spacings comparable to the wavelength of ultraviolet, visible and infrared radiation. Bragg diffraction techniques have been used to examine these polymer colloidal crystals with a view towards identifying their interparticle spacing, lattice parameters and phase transitions. U.S. Pat. No. 4,627,689 discloses a crystalline narrow band radiation filter which is made by forming a highly ordered crystalline colloidal structure within a cell. The crystalline colloidal structure is formed by dispersing electrically charged particles, for example, polystyrene particles within an appropriate solvent. U.S. Pat. No. 4,632,517 also discloses a narrow wavelength band filtering device created by forming a highly ordered crystalline colloidal structure within a cell.

More recently, it has been known that these crystalline structures can be very useful and that such structures have many practical applications for filter devices. In many instances it is necessary or desirable to filter out narrow bands of selected wavelengths from a broader spectrum of incident radiation while permitting the transmission of adjacent wavelengths. High spectral-purity commercial monochromators which are available for this purpose generally use a plurality of gratings and prisms. However, such devices are extremely complex, bulky and expensive. U.S. Pat. No. 4,632,517 discloses another crystalline colloidal narrow band radiation filter which may involve polystyrene particles. The device of this patent forms the basis for a mechanically simple and highly efficient monochromator. It has application in improved systems for investigating Raman or emission spectra of selected sample materials. U.S. Pat. No. 4,632,517 disclosed a type of solid structure in that with a lattice spacing gradient being formed and as part of this process a "freezing" of certain conditions is achieved using polymerization techniques. However, this suggestion did not disclose the unique aspects of the method and product of the present invention for forming filtering devices which are entirely solid and self-supporting.

The disclosures of U.S. Pat. Nos. 4,627,689 and 4,632,517, are expressly incorporated herein by reference.

Other filtering devices have also been known. See, for example, U.S. Pat. No. 4,803,688 which discloses ordered colloidal suspension optical devices. This patent relates to the addition of a water based polymer to a colloidal structure.

A nonlinear optical device which has a high speed switching capability at high radiation intensities and which can be used for rejecting certain undesired wavelength bands from such high intensity radiation is disclosed in Asher U.S. patent application Ser. No. 07/999,487 filed Dec. 30, 1992, entitled "A Method of Making An Optically Nonlinear Switched Optical Device and Related Devices", now U.S. Pat. No. 5,452,123. This application is owned by the assignee of the present application. This application discloses a method for making a nonlinear optical device and a related optical device. The filter effectively resists transmission of about 99.9% of radiation from a wavelength band. The material may operate as a high speed optical switch in that it becomes opaque to radiation within several nanoseconds.

Although an allusion was made to solid devices in some of the above-mentioned prior art, these patents involve crystalline colloidal structures which are not solids and are not self-supporting. Because of their high peak absorbance value, state-of-the-art colloidal crystalline array filters may be widely used for eye protection and sensor protection. However, a more rugged filter would obviously have wider application. As a result, there has been a need for a solid filter. Solids provide better mechanical stability and machinability. Non-solids, on the other hand, are subject to becoming disordered upon vibration and shock. In addition, liquid media can undergo phase transitions quite easily by freezing or boiling and this may often be undesirable.

For these reasons a solid structure is more desirable in many applications. For example, solid filtering devices are often necessary for filtering out certain bands of radiation in aviation and space travel, as they provide mechanical rigidity and this allows for a greater range of design features. It has heretofore been an extremely difficult polymer chemistry problem to create such a solid filter. See generally U.S. Pat. No. 5,131,736.

Despite all of these optical radiation filtering devices, there still remains a need for a porous polymerized film adapted to be employed for the filtration of solid or liquid materials of relatively small size. Such a filter can be of fixed or adjustable porosity. There also remains a need for the development of filters from submicron periodic materials that are polymerized into porous gel membrane filters and can be used for size selective submicron particle and molecular filtration. There also remains a need to provide a simple method of creating a gel membrane filter whose interstices allow separation of predetermined size submicron material which may be a solid, solids in a liquid, liquid out of liquids or a virus in a liquid.

SUMMARY OF THE INVENTION

These and other needs are satisfied by the present invention which provides a simple and relatively inexpensive method of creating a solid narrow band radiation filter and related devices. The narrow band radiation filter selectively and effectively filters a narrow band of wavelengths from a broader spectrum of incident radiation while transmitting adjacent wavelengths to a high degree. For example, a filter can be produced in accordance with the present invention which filters out greater than about 99 to 99.999% of a wavelength band of about 50 to 150 Å while transmitting more than about 70 to 90% of the intensity of remaining wavelengths.

A method of making the filter is also disclosed in which a crystalline structure is created which is composed of particles dispersed in a liquid medium. As used herein, "particles" includes any shape suitable for the desired filtering need, but preferably the particles for the present invention will be spheres. In accordance with one aspect of the invention, a solvent is introduced into the crystal structure that fuses the particles together. Thereafter, the solvent is evaporated to condense the particles into a three-dimensional array having a highly periodic lattice spacing. The lattice spacing is created such that it can diffract a predetermined wavelength band.

As noted hereinbefore, the particles are fused together and a geometric ordering occurs. The lattice structure exists largely due to electrical repulsive forces between the particles which each have a charge of the same polarity. Several different methods of fusing the particles together are disclosed which are set forth in further detail hereinafter.

One aspect of the method of securing the particles in the desired relative position together involves polymerization of the medium surrounding the particles to fix the particles in the desired relative spaced relationship to each other. A particular method of such polymerization includes adding acrylamide or bisacrylamide and preferably a nonionic UV photoinitiator to a colloidal solution contained between two quartz plates. Ultraviolet light is then utilized to initiate the polymerization.

In accordance with another embodiment of the method a polymer solution is introduced into the region around the polystyrene spheres. This polymer rigidizes the medium and fixes the sphere positions. The polymer may be an organic or inorganic material.

An alternate method includes providing particles, which may be polystyrene, polymethyl methacrylate or silica spheres, for example, in colloidal form with a coating which provides a film of polymerizing residue on the surfaces of the particles. The ordered colloidal array is formed and is then solidified by polymerizing together the adjacent sphere surfaces.

Another method of the invention involves packing the particles utilizing an electric field to attract the particles and further enhance the ordering of the array. Subsequent to achieving this ordering, polymerizing may be effected with the assistance of the electric field which will electrochemically initiate polymerization of material, such as acrylamide and bisacrylamide, for example.

The device resulting from the methods of this invention can form the basis for a mechanically simple and highly efficient filter which is useful in many applications, such as, for example, sensor protection, eye protection, scientific instrumentation and medical instrumentation in laser surgery. Such filters can also eliminate the need for dichroic mirrors in optic technology. Overall, the device can be used with any product in which the disclosed radiation filtering characteristics are desirable.

In another aspect of the invention, a method and product of the present invention involves filtering submicron particles has been developed which consists of establishing a gel membrane filter, from a crystalline colloidal array, with an interstitial size less than or equal to the particles to be filtered. The material to be filtered impinges upon the gel membrane filter and the membrane filter resists passage of the material through the membrane interstices. In one embodiment, the interstices are of a fixed size. In another embodiment, the membrane filter openings are of an adjustable size. The gel membrane filter may employ anisotropic interstices of submicron size. The gel membrane filter can be mechanically stretched by applying force to the gel membrane filter in one or two directions. This can be done by mechanically clamping and stretching as well known to those skilled in the art.

Another embodiment of the invention has a plurality of charged particles having a positive or negative charge with mobile oppositely charged particles disposed in the interstices of the gel membrane filter. An electric field can be employed to move the mobile particles between an open position which is substantially nonobstructing to said interstices and a closed position which obstructs a substantially greater portion of said interstices. As used herein, the term "electromagnetic field" is deemed herein to be an electric field.

As used herein, the term "material" or "materials", when used to refer to the present invention being employed as a filter or pump, shall mean the material being subjected to filtration or pumping action, including both the particles and molecules which are permitted to pass through the filter or restrain from passage through the filter. The invention also includes stacking a plurality of gel membrane filters so that a portion of the material to be filtered sequentially flows through the interstices of the filters and leaves different size submicron material on different levels of the filters.

It is an object of the invention to provide a method of creating a solid filter which can effectively filter a predetermined narrow wavelength band from a broader spectrum of incident radiation.

It is an object of the present invention to provide an inexpensive, simple method of creating a solid crystalline structure having predetermined submicron filtering characteristics.

It is another object of this invention to provide a simple method of creating a gel membrane filter whose interstices allow separation of predetermined size submicron material which may be a solid, solids in a liquid, liquid out of liquids or a virus in a liquid.

It is yet another object of this invention to provide a simple gel membrane filter whose interstices are stretchable mechanically to filter submicron material of different submicron sizes.

It is yet another object of this invention to provide a simple gel membrane filter with fixed size interstices.

It is yet another object of this invention to provide a simple gel membrane filter which is stretchable and usable to filter anisotropic particles.

It is yet another object of this invention to provide a simple gel membrane filter with both fixed and mobile particles.

It is yet another object of this invention to provide a simple gel membrane filter that is hardened by backfilling and useful in other products.

These and other objects of the invention will be more fully understood from the following description of the invention, with reference to the illustrations appended hereto.

BRIEF DESCRIPTION OF THE DRAWINGS

FIG. 3 is a schematic illustration of the electrophoretic method of organizing and polymerizing the particles in a packed array.

FIG. 3A is a cross section of the array taken along line IIIA—IIIA of FIG. 3.

FIG. 4 is a schematic illustration of the angle at which radiation is diffracted using the filter of the present invention.

FIG. 5 is a representation of a spectrum indicating the narrow band wavelengths which can be filtered using devices created in accordance with the present invention.

DESCRIPTION OF THE PREFERRED EMBODIMENTS

Figure 1:
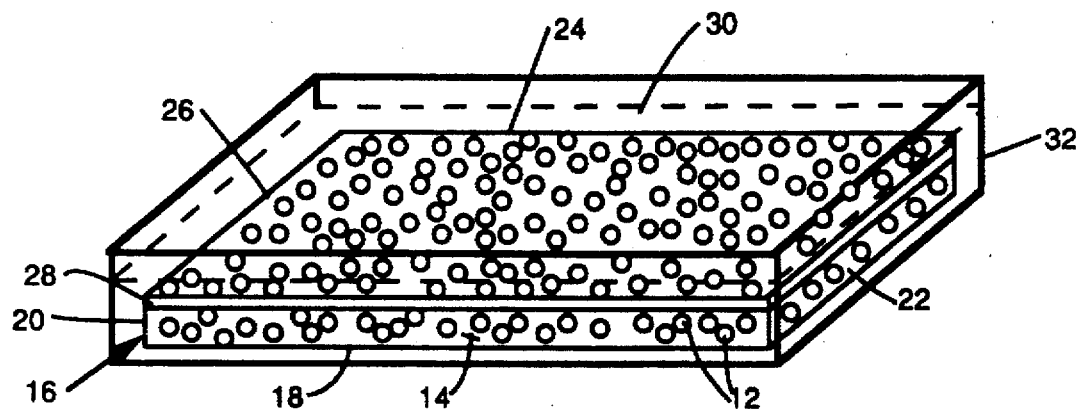
FIG. 1 is a schematic illustration of colloidal particles dispersed within a medium prior to ordering of the particles in accordance with one aspect of the present invention.

With reference to FIG. 1, there is shown a schematic illustration of a group of particles 12 prior to ordering of the array which is discussed hereinafter. Particles 12 are interdisposed within a medium 14. As will be discussed more fully hereinafter, the filtering characteristics of the filtering device so created may be varied by controlling the spacing between the particles 12 or by altering the shape and size of the particles 12.

Although not limiting the invention, in a preferred form, particles 12 are preferably composed of polystyrene, polymethylmethacrylate, silicon dioxide, aluminum oxide, fluorinated polymers, for example Teflon, or other suitable materials which are generally uniform in size and electrical charge. The material chosen depends upon the optimum degree of ordering desired in the resulting lattice. The higher the ordering of the lattice structure, the narrower the wavelength band which may be filtered with the resulting filtering device. Other parameters also affect filtering characteristics such as particle size and shape. Particles 12 used in the method of this invention preferably have a diameter between about 10 nanometers to 10 microns. These particles 12 may be synthesized using the technique disclosed hereinbelow. Alternatively they may be obtained commercially from Polysciences, Inc. of Warrington, Pa.

The particles 12 are generally stored in a dispersion including a detergent and relatively small amounts of an electrolyte. They are first cleaned of the electrolyte and surfactant impurities. This cleaning may be accomplished by dialysis against a bath of doubly distilled water containing a mixed bed ion exchange resin. After dialysis, the particles 12 may be stored in a bath of, preferably, 10% by weight suspension of ion exchange resin called Analytical Grade AG501X8 mixed bed resin obtainable from Bio-Rad of Richmond, Calif. The ion exchange resin should be cleaned prior to use through a suitable procedure such as that taught by Vanderhoff, et al. in the *Journal of Colloid Interface Science*, 1968, 28,336–337.

In the form illustrated in FIG. 1, the particles 12 are contained in a medium 14 which may be water, glycerol, ethylene glycol, methanol, ethanol, dimethyl sulfoxide, phenyl methyl sulfoxide, dioxane, dimethylformamide, polyethylene glycol, or glycerine, or any material possessing similar properties. The particles 12 within medium 14 in the form shown are placed in a generally rectangular chamber 16 which is sealed by cover 28. Chamber 16 is, preferably, composed of quartz, LEXAN or LEXAN-coated glass. Chamber 16 has bottom portion 18, and upstanding sidewalls 20, 22, 24 and 26. The suspension composed of particles 12 and medium 14 is diluted with deionized, doubly distilled water to provide a partial volume fraction in the range of about 0.5 to 75 percent. Chamber 16 is then sealed with air-tight cover 28. Sealed chamber 16 is then placed in room temperature water 30 in outer container 32 for a period of time adequate to allow the array to crystallize. This environment should also be perturbation-free. Geometric ordering of the crystalline structure then occurs.

Figure 2:
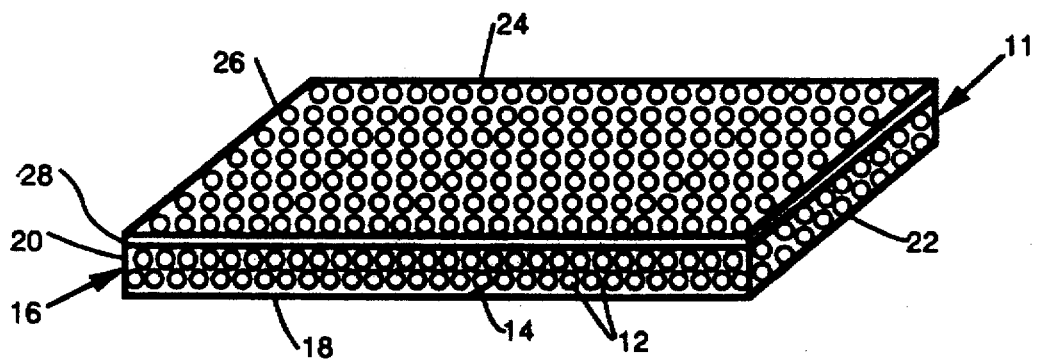
FIG. 2 is a schematic illustration of a solid crystalline array of polystyrene particles created in accordance with the method of the present invention.

FIG. 2 shows chamber 16 after removal from outer container 32. The particles 12 are packed in an ordered array 11 within chamber 16.

Turning now to further details of the method of the present invention, various aspects of the method of forming a solid crystalline structure are discussed.

In accordance with one aspect of the invention, any suitable solvent such as benzene, toluene and chloroform is added to preferably a polymer latex solution and this is added to medium 14 (FIG. 1) to fuse the particles 12 together and create an ordered array 11 as shown in FIG. 2. Preferably, polystyrene or polymethyl methacrylate spheres of about 10 nanometers to 10 microns in diameter may be used. However, any suitable particle with a polymer outer shell may be used within the method of the present invention. The solvent, when added, serves to solubilize and swell the outer shells of particles 12.

Thereafter, the solvent medium 14 is removed. A suitable method of removal of the solvent medium 14 is preferably by a gentle evaporation wherein chamber 16 is at a temperature between about 20° and 30° C. until the desired evaporation takes place.

During solvent evaporation, the particles 12 condense into an ordered three-dimensional array 11 and the surfaces of the particles 12 are fused to one another. The resulting solid array 11 can then be removed from chamber 16. This array 11 constitutes a film which is self-supporting. The film diffracts and filters radiation of specific predetermined wavelengths. The wavelengths at which such a film is effective depend upon the resulting lattice structure, however, the wavelength bands may be on the order of about 2000 to 15,000 Å. In other words, the film can be effective from the ultraviolet region through the visible spectral region and then into and through the infrared region.

EXAMPLE 1

A crystalline colloidal structure was created by a method discussed hereinbelow. This method may be used to create a filtering device which Bragg diffracts a relatively narrow wavelength band with a high rejection ratio. Spheres 12 having a diameter of between about 200 and 250 nanometers and a density of between about 1 and 1.1 were used. The spheres 12 were added to a medium 14 of water containing about 0.1 percent toluene. Spheres 12 were added to a total volume density of about $10^{13}$ to $10^{14}$ particles per cubic centimeter.

This suspension was sealed in a chamber 16 (FIG. 1) made of quartz, having internal chamber dimensions of about 5 cm×5 cm×0.5 mm. The solvent was then evaporated by placing the chamber at room temperature for about twenty hours. A solid crystalline structure was formed therein, as evidenced by a change from a cloudy appearance to an iridescent appearance.

The solid crystalline structure created from array 11 was then removed from chamber 16. The structure so formed was determined to Bragg diffract above about 99 to 99.999% of light at a maximum of about 4800 to 5200 angstroms wide wavelength band centered at about 5000 angstroms while passing about 60 to 80% of the light at adjacent wavelengths.

The filtering device so produced as a narrow band filter would be quite useful for many applications, such as goggles for filtering laser light from a pilot's eyes or for a windshield on an airplane or space vehicle. Alternatively, the material may be used in rejecting a narrow wavelength band for scientific instrumentation or in the field of optics.

In accordance with another aspect of the invention a method for preparing a solid filter by polymerization of the medium around the spheres involves addition of at least one of acrylamide and bisacrylamide and an ultraviolet photo-initiator to a colloidal solution such as that described hereinbefore. The solution is preferably contained between two quartz plates. The solution is then exposed to ultraviolet radiation which effects the desired polymerization.

In accordance with yet another aspect of the invention, a fabrication method for production of monodisperse silica spheres to be used to construct a filtering device in accordance with the method of the present invention will be disclosed. Silica particles having sulfonate groups on their surfaces were used. A preferred sulfonate material is 2-(4 chlorosulfonylphenyl)ethyl trimethoxy silane. The resultant sulfonate groups on the surface of particles are strong acid groups which dissociate to provide negative charges on the surface of the particles, which in this case are preferably spherical. It should be understood, however, that positively charged particles in lieu of negative particles may also be utilized within the scope of the present invention.

Furthermore, in accordance with this aspect of the invention, particles self-assemble into a three-dimensional array which will diffract light. The medium in which particles are dispersed may be adjusted to vary the interparticle interactions. As the medium evaporates, the particles have a high density within the medium. The adjustments may be made by including in the medium compounds such as NaCl, other salts or more broadly (a) any ionic compound or (b) any nonionic compounds having different dielectric constants. Other compounds such as styrene or silicone oil, for example, leave a residue of a material around the particles. This residue will not evaporate when the remainder of medium evaporates and it will tend to seal the spaces between the particles. This method results in a three-dimensional array having a high particle volume fraction. The material solidifies to form a homogenous solid crystalline structure which diffracts radiation. While we have used acidic materials on the surface of the particles, it is also within the scope of the present invention to use basic materials for this purpose such as quaternary amines, for example. One of the primary considerations is that the particles be electrically charged and the residue material adheres to the surface thereof.

EXAMPLE 2

Silica spheres were produced by polymerizing tetraethyl orthosilicate in a water-ethanol-ammonium hydroxide mixture using the Stöber process. The spheres were then silanized with 2-(4 chlorosulfonylphenyl)ethyl trimethoxy silane. The spheres were allowed to self-assemble into a three-dimensional array 11 (FIG. 2) in the manner hereinbefore discussed within a medium such as water. Thereafter, evaporation was then facilitated. The array was removed from chamber 16 and a homogenous solid crystalline structure was present. The structure so created was determined to Bragg diffract about 99 to 99.999% of the light at a maximum of about 4800 to 5200 angstroms wide wavelength band centered at about 5000 angstroms, while passing about 60 to 80% of the light at adjacent wavelengths.

In accordance with another aspect of the invention, a method is described with reference to FIG. 3. Polystyrene particles 34 are introduced into chamber 35 which is composed of preferably two $SnO_2$-coated quartz plates, 41 and 43. Particles 34 are sandwiched between plates 41 and 43. The chamber 35 contains a medium selected from the group consisting of water, methanol and ethanol, and a monomer such as acrylamide, bisacrylamide, methyl methacrylate or hydroxy methyl methacrylate. Chamber 35 has a suitable electric field placed across it as schematically shown by wire 37 and voltage source 39. The electric field causes upper plate 41 to be negatively charged and lower plate 43 to be positively charged. The potential across the chamber 35 is preferably about 20 to 30 volts/cm. The field is preferably applied to chamber 35 for about 5 to 10 minutes. The particles 34, being negatively charged, are attracted in the direction 47 due to the electric field. They migrate towards lower plate 43 and are packed in an ordered array against lower plate 43 in the manner shown in FIGS. 3 and 3A. Particles 34 migrate due to negatively charged sulfonates on their surfaces. Of course, it should be understood that positively charged particles could be used which would then require an appropriate adjustment in the orientation of the electric field. The surface of the particles may be positively charged using quaternary amines on the surface of the particles in which case they would migrate towards the opposite electrode. After about 5 to 10 minutes, the particles 34 become packed in the array designated generally as 49 (FIG. 3). The monomer in the liquid medium polymerizes around the particles. The polymerization may be initiated either chemically or electrochemically. The structure thereafter is gelled and solidified as the medium evaporates. A more rigid solid can be obtained by allowing the liquid medium to evaporate and condense the ordered particles into a solid array. The resulting filter is capable of diffracting or filtering radiation in accordance with lattice spacing of the array 49.

EXAMPLE 3

An electrophoretic formation method as discussed hereinbefore was practiced employing polystyrene spheres. Spheres having a diameter of about 200 to 250 nanometers and a density of between about 1 and 1.1 were used. Spheres 34 (FIG. 3) were placed in a medium 36 of water containing about 0.1 percent toluene. The density of spheres 34 within medium 36 was between about $10^{12}$ and $10^{14}$. The suspension was placed in chamber 35 made of tin oxide coated glass and having interior dimensions of about 50 millimeters×50 millimeters×0.5 millimeters.

An electric field of about 20 to 30 volts/cm was placed across chamber 35. The electric field caused the negatively-charged spheres 34 to migrate towards positive end 43. This was allowed to occur for between about 5 and 10 minutes. Thereafter, evaporation was facilitated by placing chamber 35 in an atmosphere of air kept at about room temperature, for about 16 to 20 hours. A filter film having a thickness of about 0.01 to 0.1 mm was produced which was determined to Bragg diffract above about 99 to 99.999% of light at a maximum of about 4800 to 5200 angstroms wide wavelength band centered at about 5000 angstroms while passing about 60 to 80% of the light at adjacent wavelengths.

It should be understood that the electrophoretic method disclosed herein is not the only method of packing the particles which are spheres in the exemplary embodiment. There are other methods known to those skilled in the art including gravitational settling and centrifugal settling.

With reference to FIGS. 4 and 5, the performance of the filtering device is illustrated. In FIG. 4, a beam 50 of electromagnetic radiation is incident upon a filtering device 52, made in accordance with the present invention, at an angle A. A transmitted beam 54 departs the filtering device 52 at a substantially equal angle B. A beam 56 of a narrow wavelength band is Bragg diffracted from the filtering device 52 at an angle C. In this manner, the beam 56 is effectively filtered from beam 50. The wavelength of beam 56 satisfies the Bragg diffraction equation:

$$n\lambda = 2d \sin A$$

wherein "d" represents the lattice spacing between each sphere 12 (FIG. 1) within the solid structure, "n" represents any integer which will preferably be about 1, "A" is angle A, and represents wavelength.

The curve 60 of FIG. 5 illustrates that the wavelength band which is Bragg diffracted by the filtering device 52 made in accordance with the present invention may be quite narrow. Referring still to FIG. 5, curve 73 depicts that the central wavelength of the narrow wavelength band filtered by filtering device 52 is dependent upon the incident angle as determined by the Bragg diffraction equation set forth hereinbefore. Accordingly, it will be appreciated that the filtering device is "tunable" to filter a range of different wavelength bands, by controlling and appropriately adjusting the orientation between the filtering device 52 and the incident electromagnetic radiation.

The embodiment of the invention directed toward filtering solid material will be considered in further detail with reference to FIGS. 6–10.

Figure 6:
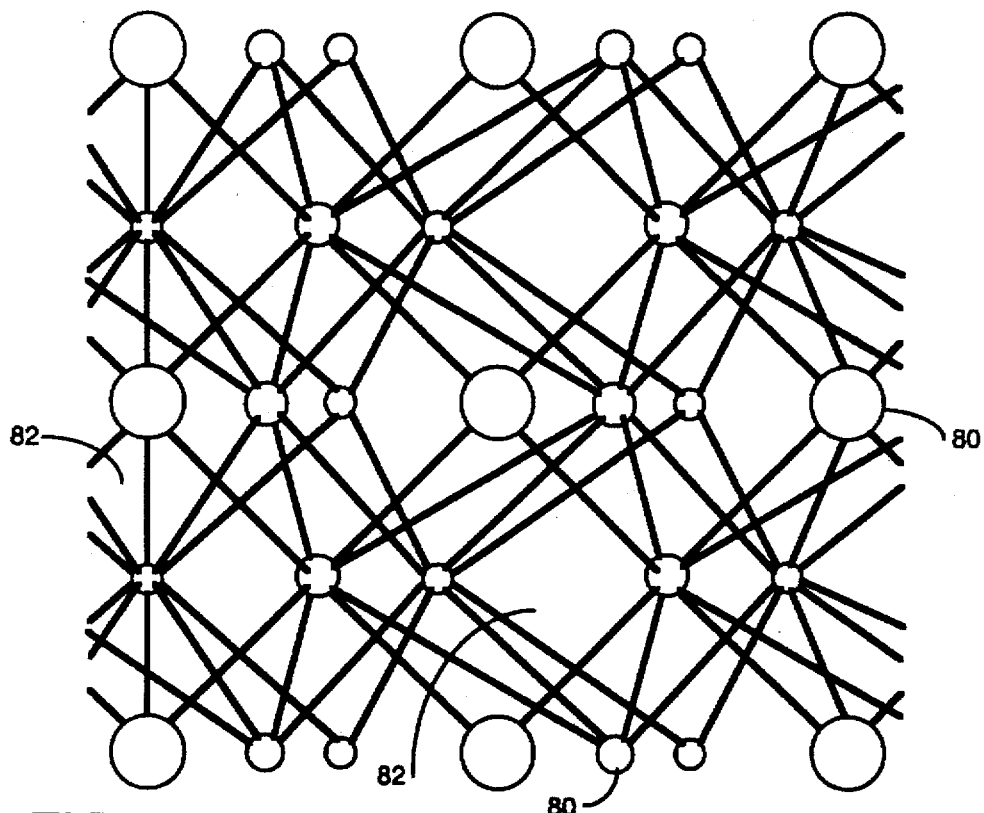
FIG. 6 shows schematically a crystalline colloidal array polymerized into a porous gel membrane filter.

FIG. 6 shows schematically a crystalline colloidal array which has been polymerized into a porous gel membrane. This gel membrane is based on the self-assembly properties of crystalline colloidal arrays. The crystalline colloidal arrays consist of polymers or inorganic particles which are preferably generally spherical and contain ionizable functional groups as described hereinbefore. The spheres 80 are synthesized to be monodisperse in size and are from about 10 nm to about 10 microns. The spheres 80 are synthesized to possess thousands of surface functional groups that ionize in solution and cause the spheres to be highly charged as described hereinbefore. The interstices 82 are used to filter the submicron material through the openings between the spheres 80.

In sufficiently high concentration the spheres 80 form a face centered (FCC) or body centered cubic (BCC) lattice if the ionic strength of the solution remains low. The lattice constant depends upon the sphere number density and crystal structure formed. The choice of a BCC or FCC lattice depends upon the form of the interaction potential between spheres. The crystalline colloidal array is then polymerized into a porous gel structure. The periodicity of the crystalline array is stabilized in a network that permits the diffusion of submicron material through the interstices 82.

EXAMPLE 4

Crystalline colloidal arrays in the liquid phase are made out of 150 nm diameter spheres. The colloidal array has (a) polymerizable monomers such as acrylamide, N,N'-methylene, bisacrylamide, N-vinylpyrrolidone and (b) a polymerizing initiator such as benzoin methyl ether. Polymerization is initiated such as by UV light while the monomers are dissolved in the crystalline colloidal array medium. The elastic gel filter membrane formed is a solvated, macroscopic, porous, cross-linked, polymer network. This elastic gel filter membrane contains submicron periodic structures which can be tailored for use as smart materials. This gel filter membrane can be used as is or chemically altered. The gel filter membrane can be further rigidized by adding additional species to be polymerized.

In the passive membrane filter of this invention, the crystalline array is fixed in position by gelation and molecules smaller than the fixed interstices can diffuse through the lattice of the gel membrane. The gel membrane is extremely uniform in interparticle spacing and size cut-off and can be fabricated to any size desired by choosing an appropriate lattice constant and by selecting an appropriate sphere diameter. Those skilled in the art may readily determine the desired interparticle interaction potential in order to maintain maximum colloidal ordering in the presence of the disruptive forces associated with the polymerization. See for example: Zahorchak et al., "Melting of colloidal crystals: A Monte Carlo study", J. Chem. Phys., 96(9), May 1992; Rundquist et al., "Photothermal compression of colloidal crystals", J. Chem. Phys., 94(1), January 1991; Kesavamoorthy et al., "Colloidal crystal photothermal dynamics", J. Chem. Phys., 94(7), April 1991; Rundquist et al., "Collective diffusion in colloidal crystals", J. Chem. Phys., 95(11), December 1991.

Figure 7:
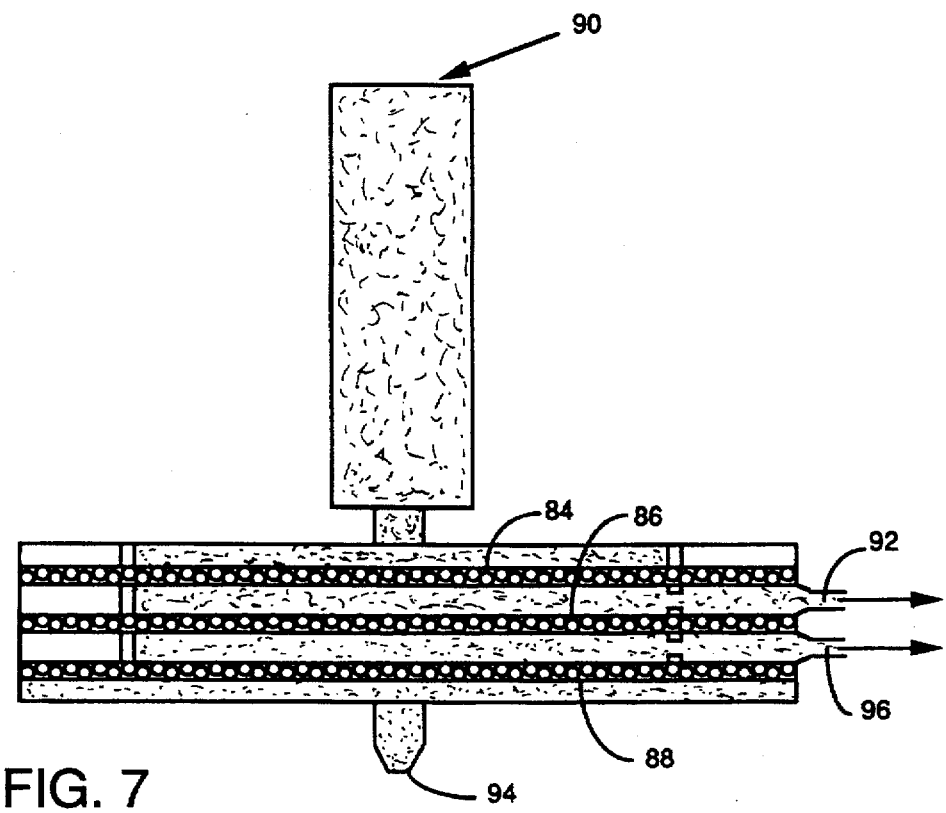
FIG. 7 is a schematic cross-section in the system fabricated as a stack of membranes that serve as a size selective separation system.

This embodiment also facilitates the use of a stack of these gel membranes which serve as a size selective separation system as shown as a schematic cross section in FIG. 7. An array of membranes 84, 86 and 88 are set up which allows retention by filtration of particles of any size between about 5 Å and 100 microns with a very small deviation in the cut-off size. The sample inlet is designated 90 and the sample outlets are 92, 94 and 96. The material to be filtered is placed in the sample inlet 90 and the filters 84, 86 and 88 are arranged so that the larger submicron material is filtered first and continues by pressure flow until filter 88 filters the smallest desired submicron material.

Figure 8:
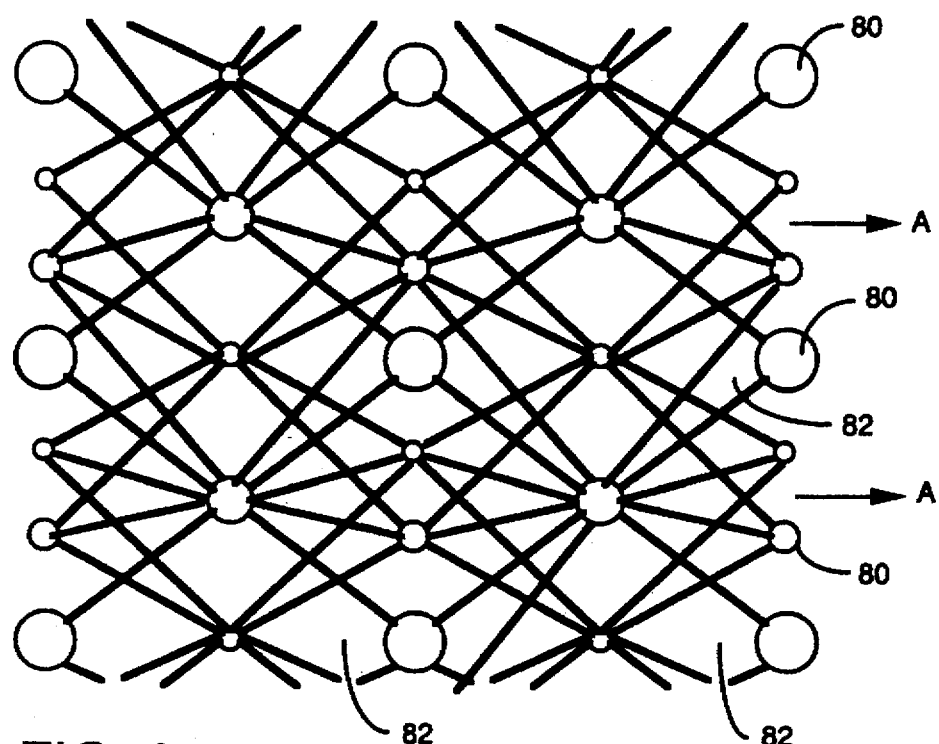
FIG. 8 is a schematic cross-section wherein stretching or compressing the gel membrane filter causes the lattice constant to asymmetrically change so that different size submicron material of different sizes and shapes can be filtered.

In another embodiment of this invention, the gel membrane filters can be made elastic to permit the filter to be stretched or compressed to alter the interstices' size and shape. As shown in FIG. 8, stretching in the direction of arrows A or compressing the membrane causes the lattice constant to asymmetrically change. This stretching elongates the interstices 82 along the stretched direction and permits the flow of anisotropic molecules through the elongated interstices. The stretching may be effected by applying opposed forces to effect stretching in one direction preferably by clamping opposite ends of the filter. If desired, one may simultaneously stretch in a second direction as by clamping and applying force along an axis generally perpendicular to the first forces. The amount of applied force and whether stretching is effected in one or two directions will be dependent on what shape or size openings are desired. This embodiment is very useful for the highly size selective separation of anisotropic large particles such as viruses or certain nonglobular proteins.

Figure 9:
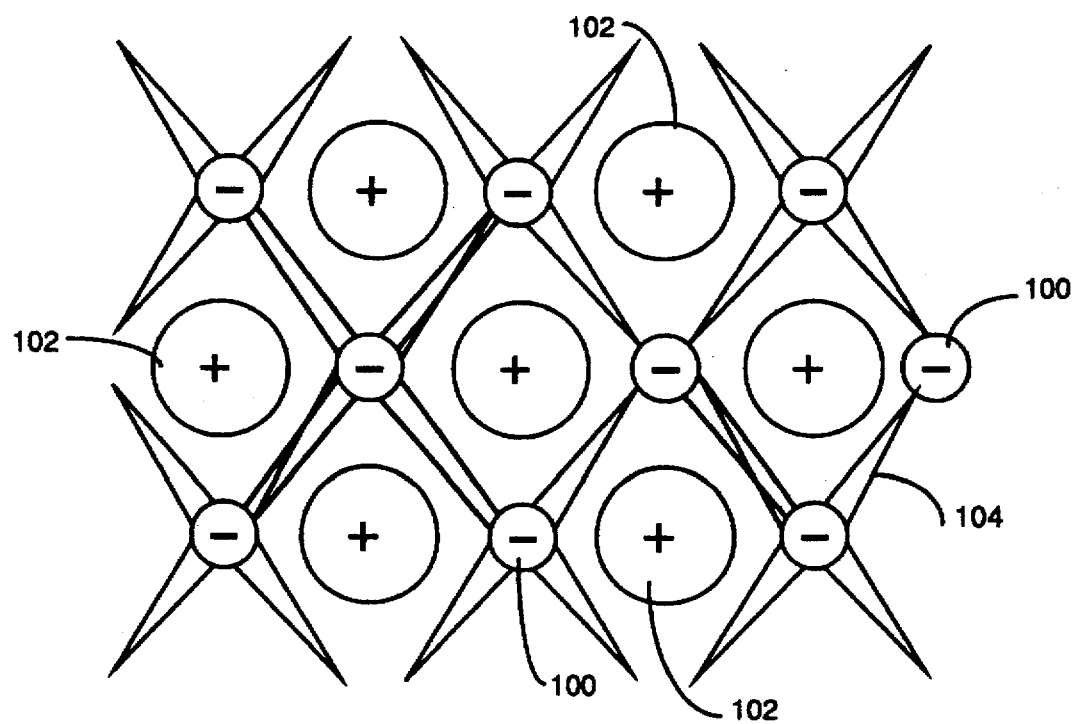
FIG. 9 is a schematic illustration of an embodiment of the gel membrane filter which has a fixed lattice of negatively charged particles and a mobile array of positively charged particles and mobile particles in the closed position.

In another embodiment of this invention, a lattice generally similar to sodium chloride with positive and negative spheres is formed. Using the polymerized lattice as a scaffold, spheres having an opposite charge from the lattice are diffused into the interstices as shown in FIG. 9. In FIG. 9, lattice spheres 100 are negatively charged. This lattice was polymerized with a loose gel. Positive spheres 102 were then diffused into the negative sphere scaffold lattice 104. This shows the lattice in a closed position with the positive spheres restricting passage of the materials through the openings.

In the embodiment described hereinbefore, there is a fixed lattice of negatively charged spheres and a mobile array of positively charged spheres that can be controlled with an electric field as well known to those skilled in the art. Alternatively, there can also be a fixed lattice of positively charged spheres and a mobile array of negatively charged spheres controlled the same way. These mobile particles are selected from the group consisting of polymer and inorganic charged particles.

An equilibrium lattice generally similar to that of NaCl is formed. However, the relative size of the positive spheres can be made large or small compared to the negative spheres and the charge on the positive spheres can be independently varied.

Figure 10:
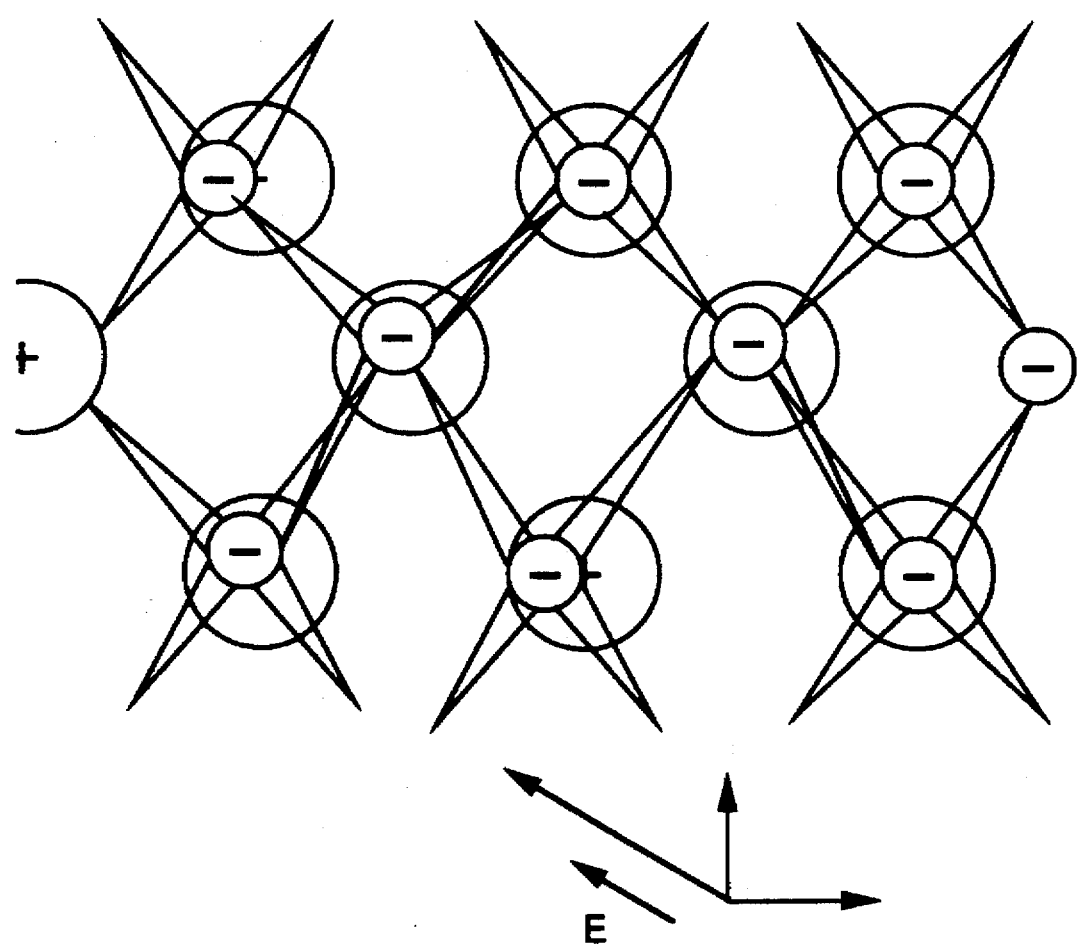
FIG. 10 shows the embodiment of FIG. 9 under the influence of an electric field E with the mobile particles in an open position.

The interaction potential between the dimer sites will be dipolar. Application of an electric field E in FIG. 10 (in a direction generally normal to the paper) will cause the dipolar lattice sites to reorient because the negative spheres in this embodiment are fixed in position on the lattice and the positive spheres are free to move. In one application of this embodiment, an electric field E is arranged across the membranes by applying a potential difference across electrodes on the membrane surface. As shown in FIG. 10, application of the electric field E causes the positive spheres to be removed from the interstices of the lattice and to lie along an axis normal to the membrane lines of negative spheres and the material will be able to diffuse through the interstices. Each negative shown is a line of spaced negatives projecting into the paper. Each positive is a plurality of mobile particles. Application of a potential generally in the place of the membrane will cause the positive spheres to reorient along the membrane and leave the interstices closed as was shown in FIG. 9. This is an example of an electronically switchable (smart) membrane and can be used as a size selective membrane filter.

In another application of this embodiment the electrodes are arranged such that the positive spheres are caused to orbit the negative spheres and act as an active pump to pump fluid or small particles through the interstices of the membrane. In order to cause the positive spheres to orbit the negative spheres, electrodes are set up which are always of an opposite charge to the positive spheres. These electrodes are switched on to provide a force in a first direction due to opposite polarity causing the positive spheres to move through a first portion of its orbit and the electrodes are switched to another mode so as to cause the force to move the positive particles through a second portion of this orbit. These electrodes and switching means are well known to those skilled in the art.

In another embodiment the gel membrane containing spheres of about 10 nm to 10 microns is further hardened through backfilling with a polymer selected from the group consisting of acrylamide, N-vinylpyrrolidone, and N,N'-methylene bisacrylamide and this hardened material is then employed whole or broken into small pieces of at least about 10 microns and mixed with a coating to give the coating refractive properties. A paint made by this method would exhibit iridescence and a nail polish would possess pearlescence.

It will be appreciated therefore that the invention has provided a method for creating a solid filtering device which is capable of Bragg diffracting narrow bands of radiation. The disclosure includes several embodiments and aspects of the method of the invention which provides for versatility in preparing filtering devices for desired applications.

The invention also provides a method for creating gel membrane filters to selectively filter submicron size material. These filters are based on the self-assembly properties of crystalline colloidal arrays and includes several embodiments and aspects of the invention which provides for versatility in preparing gel membrane filtering devices to be used in different applications. This is a method for making gel membranes with fixed interstices. These filters may be used singly for filtering submicron material or arranged in a ladder array for filtering various size material on different levels. Another embodiment involves a method for making a gel membrane with flexible interstices so they can be stretched or compressed either mechanically or electromagnetically. The invention also includes the product, the gel membrane and the filters themselves.

Whereas particular aspects of the present invention and particular embodiments of the invention have been described hereinbefore for purposes of illustration, it will be appreciated by those skilled in the art that numerous variations of the details may be made without departing from the invention as described in the appended claims.

What is claimed is:

1. A method of filtering submicron size material comprising:
    establishing a self-supporting gel lattice membrane filter which is an ordered array of charged particles in a lattice;
    establishing said membrane filter with an interstice size less than or equal to the material to be filtered; and
    causing material containing said submicron size material to impinge upon said membrane filter, thereby resisting passage of said material through said membrane filter.

2. The method of claim 1, including creating anisotropic interstices to facilitate filtering anisotropic material.

3. The method of claim 1, including employing interstices of submicron size.

4. The method of claim 3, including using interstices having a maximum opening dimension of about 1 nm to 10 microns.

5. The method of claim 4, including using interstices having an opening with a maximum opening dimension of about 1 nm to 1 micron.

6. The method of claim 5, including employing a self-supporting gel membrane filter which is stretchable and altering the size of said interstices by stretching said membrane filter.

7. The method of claim 6, including effecting said stretching by applying mechanical forces to said gel membrane filter.

8. The method of claim 7, including securing to said gel lattice membrane filter a plurality of particles having a first charge and introducing oppositely charged mobile particles into said interstices of said gel lattice membrane filter.

9. The method of claim 8, including employing an electromagnetic field to move said oppositely charged particles between an open position which is substantially non-obstructing to said interstices and a closed position which obstructs a substantially greater portion of said interstices.

10. The method of claim 9, including employing positively charged mobile particles.

11. The method of claim 9, including employing negatively charged mobile particles.

12. The method of claim 9, including employing mobile particles selected from group consisting of polymer and inorganic charged particles.

13. The method of claim 9, including using for the particles of first charge, particles selected from the group consisting of polystyrene, polymethyl methacrylate and silica in the gel membrane filter.

14. The method of claim 6, including effecting said stretching by applying an electromagnetic field to said membrane filter.

15. The method of claim 14, including applying said electromagnetic field generally perpendicularly to the plane of said membrane filter.

16. The method of claim 5, including employing the gel membrane filter having fixed interstice size.

17. The method of claim 16, including employing a gel membrane filter wherein the interstices retain material from about 5 Å to 100 microns.

18. The method of claim 5, including using spherical particles having an average diameter of about 10 nm to 10 microns.

19. The method of claim 18, including employing a gel membrane filter having a thickness of from 10 nm to 1 micron.

20. The method of claim 1, including positioning a plurality of said filters in relative close adjacency so that material sequentially flows through said interstices of said filters leaving on said filters particles of diameter of about 5 Å to 100 microns.

21. A method of filtering submicron size material consisting of:

establishing a self-supporting gel membrane filter which is an ordered array of charged particles in a lattice;

securing to said lattice a plurality of particles having a first charge and introducing oppositely charged mobile particles into the interstices of said gel lattice membrane filter; and employing said oppositely charged particles to pump liquid through said interstices of said lattice.

* * * * *